(12) United States Patent
Liang et al.

(10) Patent No.: US 9,609,765 B2
(45) Date of Patent: Mar. 28, 2017

(54) CHASSIS OF ELECTRONIC DEVICE

(71) Applicants: INTEL CORPORATION, Santa Clara, CA (US); Xiaoguo Liang, Shanghai (CN); Chung-Hao Chen, Portland, OR (US); Alexander Uan-Zo-Li, Hillsboro, OR (US); Sheng Ren, Shanghai (CN); Hong W. Wong, Portland, OR (US)

(72) Inventors: Xiaoguo Liang, Shanghai (CN); Chung-Hao Chen, Portland, OR (US); Alexander Uan-Zo-Li, Hillsboro, OR (US); Sheng Ren, Shanghai (CN); Hong W. Wong, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 290 days.

(21) Appl. No.: 14/129,597

(22) PCT Filed: Sep. 27, 2013

(86) PCT No.: PCT/CN2013/084491
§ 371 (c)(1),
(2) Date: Dec. 27, 2013

(87) PCT Pub. No.: WO2015/042882
PCT Pub. Date: Apr. 2, 2015

(65) Prior Publication Data
US 2015/0223351 A1 Aug. 6, 2015

(51) Int. Cl.
*H05K 5/00* (2006.01)
*H04M 1/02* (2006.01)
(Continued)

(52) U.S. Cl.
CPC .......... *H05K 5/0026* (2013.01); *G06F 1/182* (2013.01); *H01G 2/04* (2013.01); *H01G 4/30* (2013.01);
(Continued)

(58) Field of Classification Search
CPC .......... G06F 1/1613; H01G 4/30; H01G 4/33; H04B 15/005; H04M 1/0202; H04M 1/0277
See application file for complete search history.

(56) References Cited

U.S. PATENT DOCUMENTS 4,992,060 A * 2/1991 Meyer .................... H04B 15/02
333/12
5,107,404 A * 4/1992 Tam ......................... H04B 1/38
361/736

(Continued)

FOREIGN PATENT DOCUMENTS

CN   201699461 U    1/2011
CN   102231768 A    11/2011

OTHER PUBLICATIONS

International Search Report and Written Opinion received for PCT Patent Application No. PCT/CN2013/084491, mailed on Jun. 30, 2014, 14 pages.

*Primary Examiner* — Zachary M Pape
*Assistant Examiner* — Douglas Burtner
(74) *Attorney, Agent, or Firm* — KED & Associates LLP

(57) ABSTRACT

A chassis for an electronic device may include a first metal layer to form an inner surface of the chassis, an insulating layer on the first metal layer, and a second metal layer on the insulating layer. The second metal layer may be connected to a ground area of a circuit board to be provided in the chassis.

16 Claims, 7 Drawing Sheets

(51) Int. Cl.
*H04B 15/00* (2006.01)
*H01G 4/30* (2006.01)
*H01G 2/04* (2006.01)
*G06F 1/18* (2006.01)
*G06F 1/16* (2006.01)
*H04B 15/02* (2006.01)

(52) U.S. Cl.
CPC ........ *H04B 15/005* (2013.01); *H04M 1/0202* (2013.01); *G06F 1/1613* (2013.01); *H04B 15/02* (2013.01); *H04M 1/0277* (2013.01)

(56) References Cited

U.S. PATENT DOCUMENTS

| | | | | |
|---|---|---|---|---|
| 6,442,013 B1* | 8/2002 | Lindgren | ............ | H04M 1/0202 340/870.37 |
| 9,124,009 B2* | 9/2015 | Atkinson | ................ | H01R 9/034 |
| 2004/0145527 A1* | 7/2004 | Mikkola | ................ | H01Q 1/243 343/700 MS |
| 2004/0166895 A1* | 8/2004 | Koenck | ............... | G06F 15/0225 455/556.1 |
| 2007/0153886 A1 | 7/2007 | Yukutake et al. | | |
| 2008/0119246 A1* | 5/2008 | Kang | .................. | H04M 1/0277 455/575.1 |
| 2008/0124982 A1* | 5/2008 | Kim | ........................ | H01R 9/05 439/676 |
| 2009/0213524 A1* | 8/2009 | Kang | .................... | H01Q 1/243 361/301.2 |
| 2009/0293247 A1* | 12/2009 | Chiang | .................. | H01G 4/008 29/25.02 |
| 2009/0308653 A1* | 12/2009 | Wu | ........................ | H01Q 1/526 174/377 |
| 2010/0091442 A1* | 4/2010 | Theobald | ............ | G06F 1/1616 361/679.09 |
| 2010/0148304 A1* | 6/2010 | Rahim | ................ | H01L 23/5223 257/532 |
| 2011/0255850 A1* | 10/2011 | Dinh | ...................... | G03B 15/03 396/176 |
| 2012/0214412 A1* | 8/2012 | Schlub | .................. | G01B 7/023 455/41.1 |
| 2012/0248571 A1 | 10/2012 | Lin et al. | | |
| 2013/0143383 A1 | 6/2013 | Malhotra et al. | | |
| 2013/0235497 A1* | 9/2013 | Ma | ........................ | H02H 9/046 361/56 |

* cited by examiner

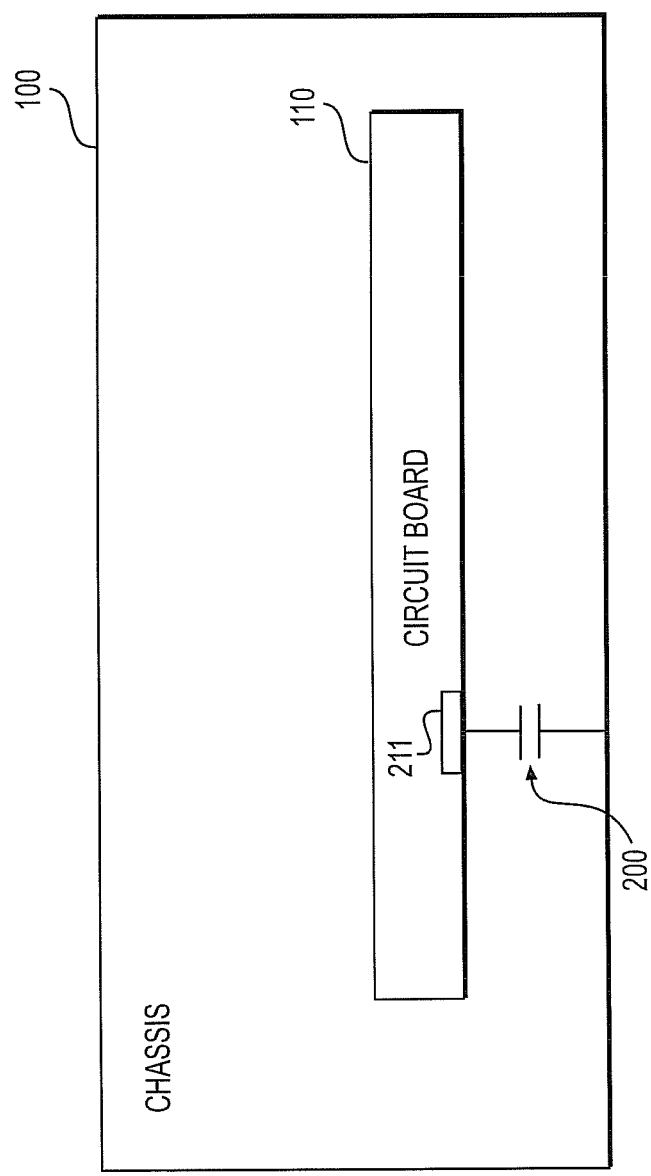

CHASSIS OF ELECTRONIC DEVICE

This application is a U.S. National Stage Application under 35 U.S.C. §371 of PCT Application No. PCT/CN2013/084491, filed Sep. 27, 2013.

BACKGROUND

1. Field

Embodiments may relate to a chassis for an electronic device.

2. Background

An electronic device may utilize a charging system in order to perform operations, such as charging a battery, providing a display image, etc. However, disadvantageous leakage current may occur.

BRIEF DESCRIPTION OF THE DRAWINGS

Arrangements and embodiments may be described in detail with reference to the following drawings in which like reference numerals refer to like elements and wherein:

FIG. 7 is a diagram of a chassis according to an example embodiment.

DETAILED DESCRIPTION

In the following detailed description, like numerals and characters may be used to designate identical, corresponding and/or similar components in differing drawings. Further, in the detailed description to follow, example sizes/models/values/ranges may be provided although embodiments are not limited to the same. Where specific details are set forth in order to describe example embodiments, it should be apparent to one skilled in the art that embodiments may be practiced without these specific details.

Embodiments may relate to a metal-insulator-metal (MIM) chassis structure (or chassis) for an electronic device. The chassis structure may reduce leakage current when the electronic device is coupled to a charging system, such as a charging system having an alternate current (AC) power adapter (or AC brick).

The electronic device may be any one of a mobile terminal, a mobile device, a mobile computing platform, a mobile platform, a laptop computer, a tablet, an ultra-mobile personal computer, a mobile Internet device, a smartphone, a personal digital assistant, a display device, a television (TV), etc. For ease of discussion, embodiments may be described with respect to a laptop computer. However, other implementations may also be provided.

An AC power adapter (or an AC brick) may be specifically designed to meet safety regulations. As one example, an AC power adapter may be designed to minimize leakage current from an AC power source.

Due to leakage current, a user may feel a tingling sensation when the AC power adapter is connected to a chassis of the electronic device and the user touches the chassis. In this situation, the leakage current may pass through the body of the user to a ground (or an earth ground). This may hereafter be referred to as a tingling effect.

Figure 1:
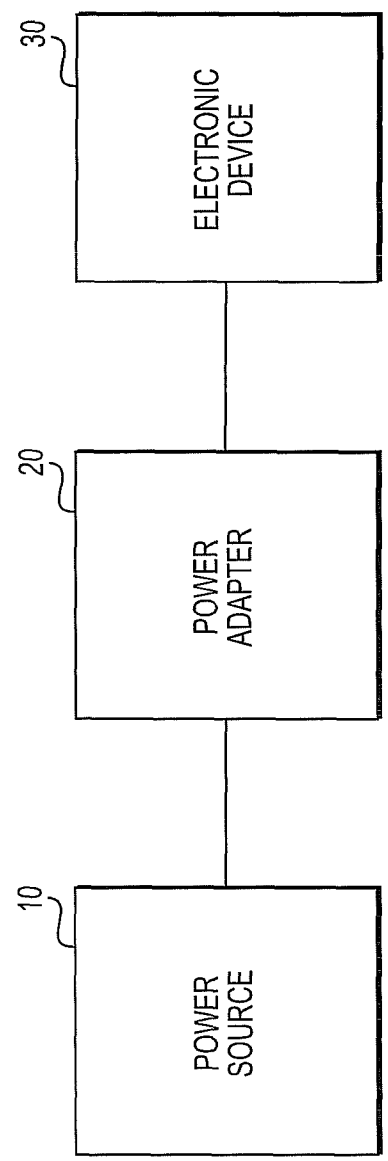
FIG. 1 shows a charging system of an electronic device according to an example arrangement.

FIG. 1 shows a charging system of an electronic device according to an example arrangement. Other arrangements and configurations may also be provided. The features of FIG. 1 may also be considered an apparatus, a system and/or an electronic device.

More specifically, FIG. 1 shows a power source 10 (or power supply), a power adapter 20 (or brick) and an electronic device 30. The power source 10 may be an AC power source, for example. The power adapter 20 may be called an AC brick to provide power to the electronic device 30. The power adapter 20 may receive power from a power source.

The electronic device 30 may include a wireless charger, a battery charger, a voltage regulator, a battery, a battery port and/or a load. The load may include a processor, a display, a speaker, etc. Other components may also be provided at the electronic device 30. Various circuits and components may be provided on a circuit board within the electronic device 30. The circuit board may receive a plurality of electrical components. The circuit board may have a ground area. The circuit board of the electronic device may be grounded to a chassis of the electronic device 30 to achieve better electromagnetic compatibility (EMC) and electrostatic discharge (ESD) performance for the charging system in FIG. 1.

Figure 2:
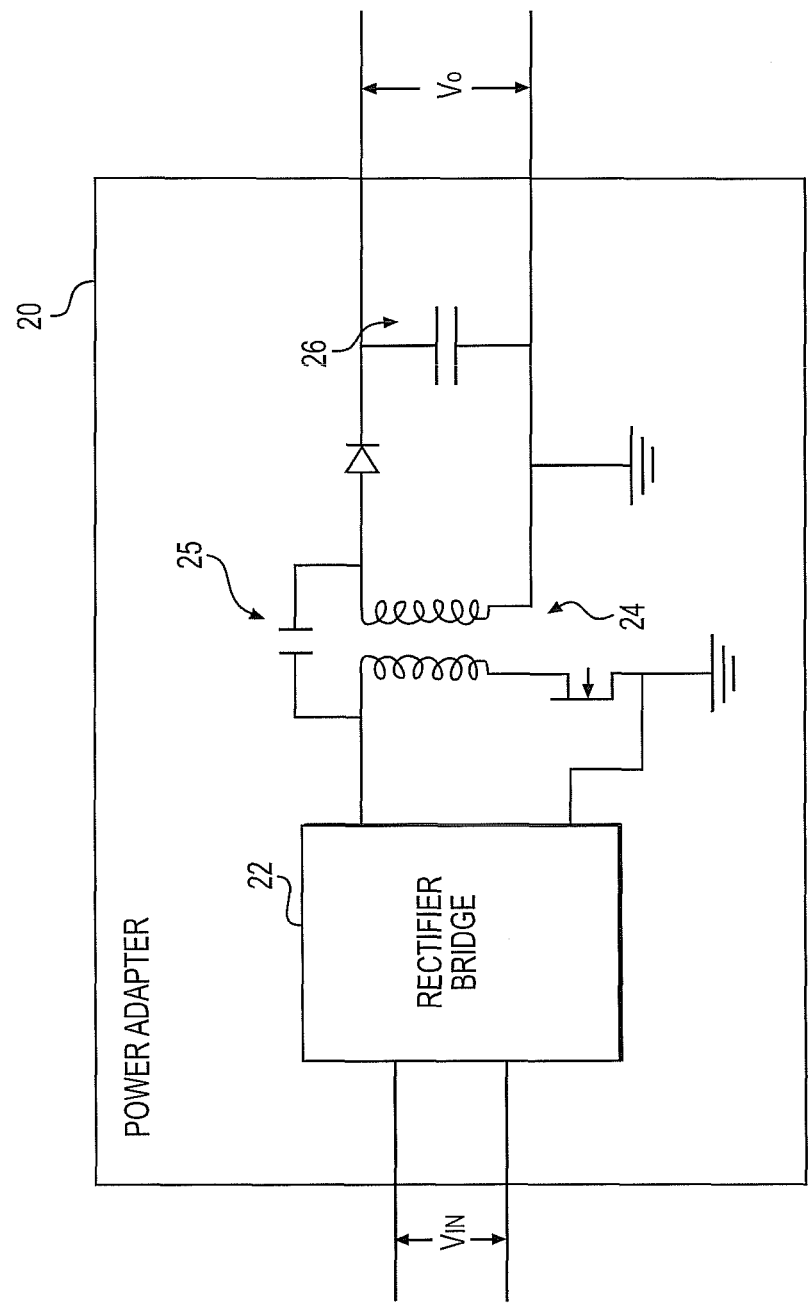
FIG. 2 shows a power adapter (or brick) according to an example arrangement.

FIG. 2 shows a power adapter according to an example arrangement. Other arrangements may also be provided. The power adapter may also be called a brick, such as an AC brick.

FIG. 2 shows that an AC voltage Vin (or AC power) may be received from the power source, such as the power source 10. The power adapter 20 may include a rectifier bridge 22, a transformer 24, a first capacitor 25 and a second capacitor 26. Other components may also be provided, such as a switch and a diode. The power adapter 20 may provide an output voltage Vo based on the input AC voltage. Other types of power adapters may also be used.

The first capacitor 25 may also be called a Y capacitor, which may be named as Cy.

Figure 3:
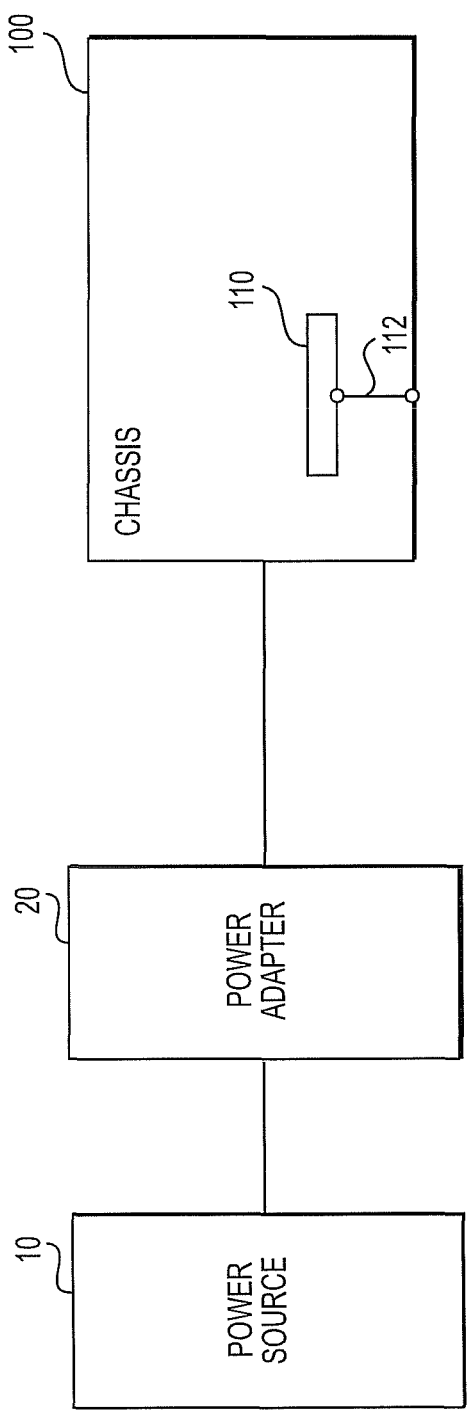
FIG. 3 shows a chassis and a charging system according to an example arrangement.

FIG. 3 shows a chassis (or an electronic device) and a charging system according to an example arrangement. Other arrangements and configurations may also be provided.

FIG. 3 shows the power source 10, the power adapter 20 and a chassis 100 (of the electronic device 30). The chassis 100 may foam an outer surface of the electronic device 30. In this example, the chassis 100 may be formed of a metal and/or a metal layer. The chassis 30 may provide a structural support of components.

As shown in FIG. 3, a circuit board 110 (or motherboard) may be provided within the chassis 100 (or at the chassis 100). The circuit board 110 may receive power from the power adapter 20 or from an internal battery of the electronic device. Numerous circuits and components may be provided on the circuit board 110 in order to perform operations of the electronic device 30. The circuit board 110 may include a ground (or ground area) in order to provide a power return path and signals reference plane.

As shown in FIG. 3, the circuit board 110 may be coupled to the chassis 100. As one example, the ground area of the circuit board 110 may be electrically connected by a wire 112 to the chassis 100. The chassis 100 may thereby serve as a ground to power components (or electrical components) within the electronic device 30.

During operation of the electronic device, leakage current may occur based on AC power from the power source 10 and the power adapter 20 (or AC brick). For example, when the power adapter 20 is a two prone AC brick, then current may leak through a capacitor 25 (Cy) provided inside the power adapter 20 (i.e., the brick) to the ground (or ground area) of the circuit board 110. From the ground of the circuit board 110, current may be conducted to a metal surface (of the chassis 100) and through a body of the user to an earth ground.

Increasing an impedance of the current path may improve the leakage current. One example to increase the impedance is to reduce a value of the capacitor 25 (Cy). However, the capacitor 25 (Cy) may be designed for mitigating conductive electromagnetic interference (EMI) noise for the AC brick 20, so too much reduction of Cy may cause EMI performance to suffer. Another way to reduce leakage current is to provide an additional shield for the transformer (of the power adapter) that: 1) increases transformer complexity, 2) consumes lots of time for shield optimization, and 3) requires extremely consistent transformer manufacturing. However, the cost for these features may be high.

Figure 4:
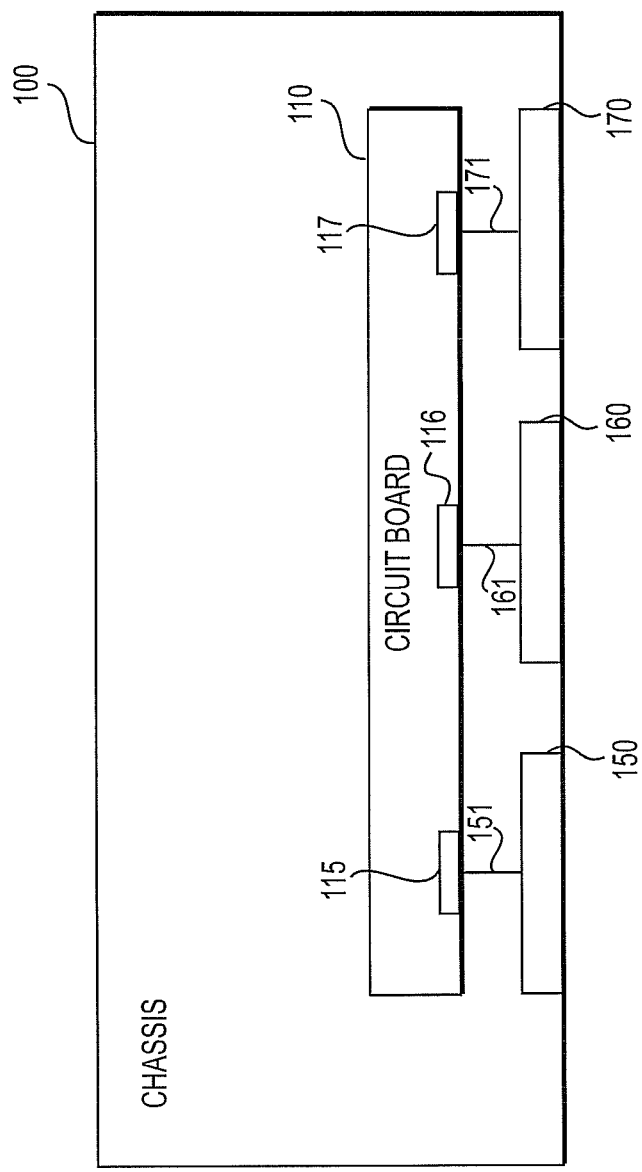
FIG. 4 shows a chassis according to an example embodiment.

FIG. 4 shows a chassis according to an example embodiment. Other embodiments and configurations may also be provided. The chassis may be a chassis of an electronic device.

As shown in FIG. 4, the circuit board 110 (or motherboard) of the electronic device may be provided within the chassis 100. Numerous circuits and components may be provided on the circuit board 110 (or at the circuit board) to perform various operations of the electronic device 30. The circuits and/or components may receive input power from the power adapter 20, for example. The circuit board 110 may include a ground area (or areas) in order to provide a proper power flow. FIG. 4 shows ground areas 115, 116 and 117, which may be commonly coupled together.

In at least one embodiment, a capacitive device 150 may be provided at the chassis 100 in order to couple to the ground area 115 of the circuit board 110. The capacitive device 150 may be referred to as a metal-insulator-metal device, a chassis structure and/or a capacitor.

In at least one embodiment, a plurality of capacitive devices may be provided at the chassis 100 at any of a plurality of different areas of the chassis 110. Each of the plurality of capacitive devices may be electrically coupled to ground of the circuit board 110. FIG. 4 shows the capacitive devices 150, 160, 170 at each of a plurality of different areas of the chassis 100.

The capacitive devices 150, 160, 170 may reduce leakage current. For example, the capacitive device 150 may be connected between the ground area 115 of the circuit board 110 and an inner surface of the chassis 100. The capacitive device 150 may be coupled to the ground area 115 of the circuit board 110 by a wire 151, a metal screw, a metal spring, an electrical connecting device, etc.

The capacitive device 160 may be connected between the ground area 116 of the circuit board 110 and an inner surface of the chassis 100. The capacitive device 160 may be coupled to the ground area 116 of the circuit board 110 by a wire 161, for example.

The capacitive device 170 may be connected between the ground area 117 of the circuit board 110 and an inner surface of the chassis 100. The capacitive device 170 may be coupled to the ground area 117 of the circuit board 110 by a wire 171, for example.

In at least one embodiment, only one capacitive device may be provided at the chassis 100. The one capacitive device may be electrically coupled to the ground area of the circuit board 110.

Figure 5:
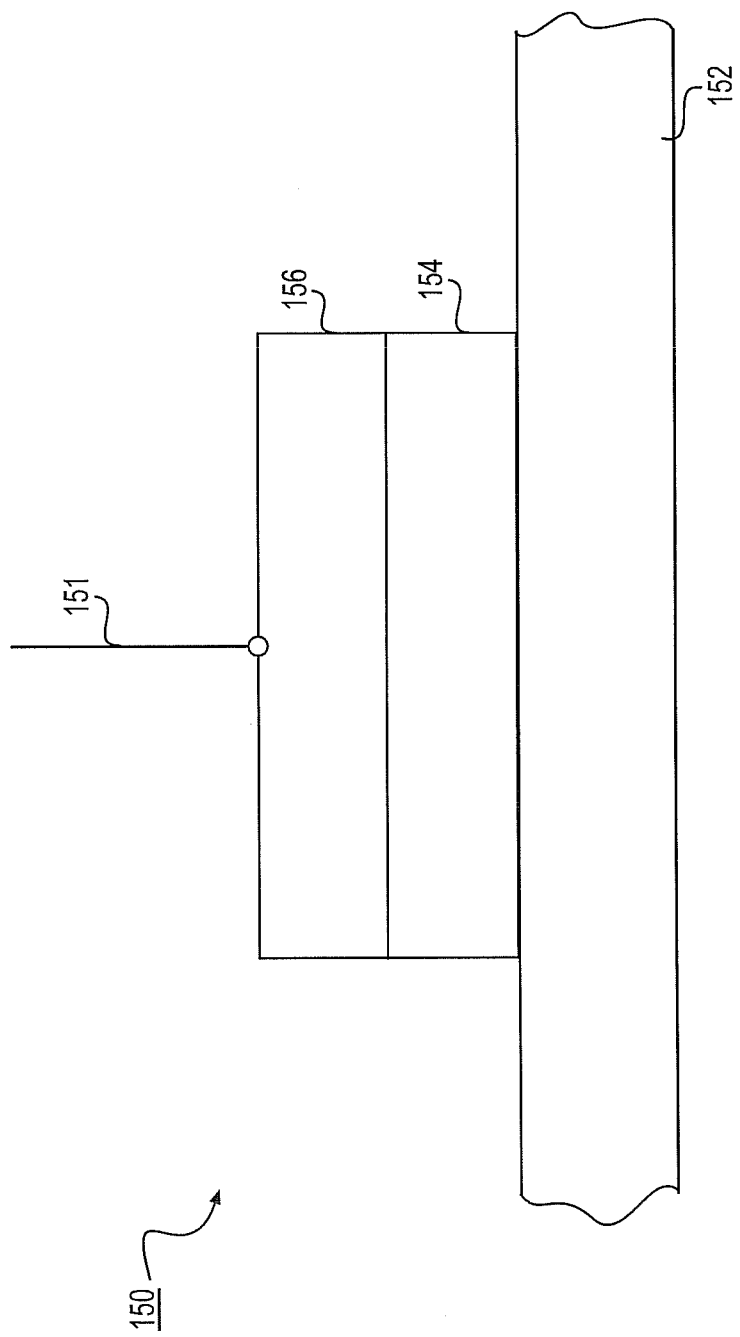
FIG. 5 shows a capacitive device according to an example embodiment.

FIG. 5 shows a capacitive device according to an example embodiment. Other embodiments and configurations may also be provided. FIG. 5 will be discussed with respect to the capacitive device 150, although the structures, configurations and embodiments may be applied to other capacitive devices.

FIG. 5 shows the capacitive device 150 includes a first metal layer 152, an insulating layer 154 and a second metal layer 156 (or connecting metal layer). The insulating layer 154 may be provided between the first metal layer 152 and the second metal layer 156.

The first metal layer 152 may be a metal layer that forms an inner surface of the chassis 100.

The second metal layer 156 may be coupled to the ground area of the circuit board 110 by the wire 151, for example. The second metal layer 156 is separated from an inner surface (i.e., the first metal layer 152) of the chassis 100 by the insulating layer 154. The essence of this structure is to form one equivalent capacitor. An area of the first metal layer 152 and the second metal layer 156 may be identical or may be different. A height, an area and a dielectric constant of the insulating layer may be intentionally selected to achieve desired capacitance formed by the capacitive device 150.

Figure 6:
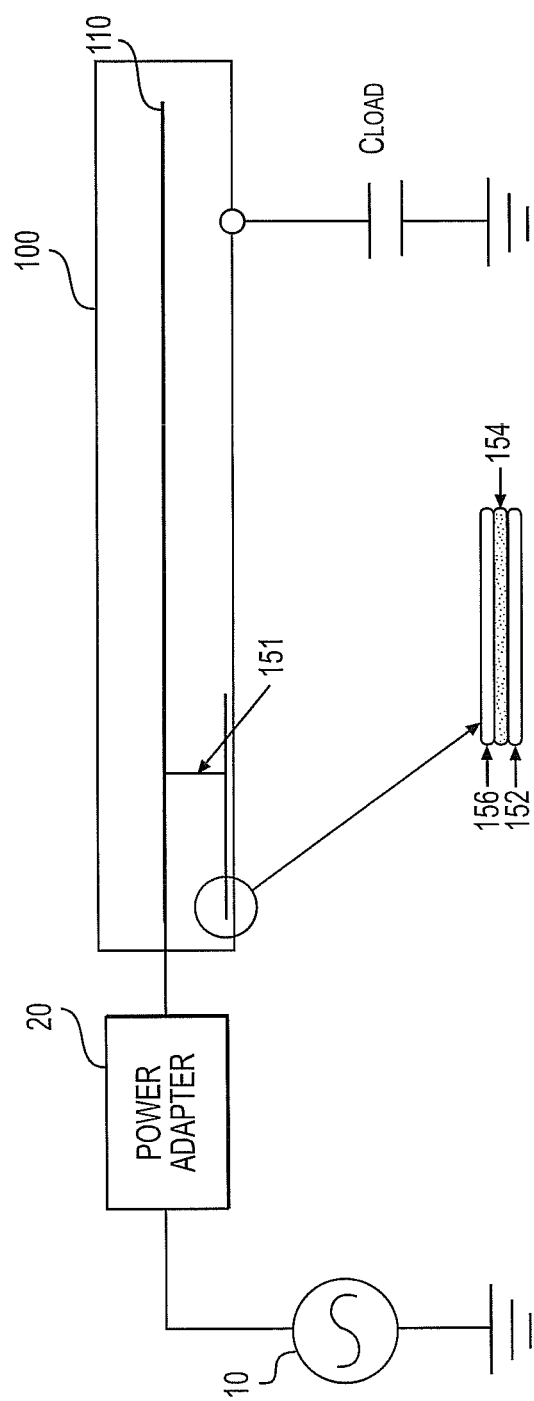
FIG. 6 is a diagram to show an embodiment having reduction of leakage current according to an example embodiment.

FIG. 6 is a diagram to show an embodiment having reduction of leakage current according to an example embodiment. Other embodiments and configurations may also be provided. In this diagram, the human body may be modeled as a capacitor Cload.

When the chassis 100 includes the capacitive device (i.e., a MIM structure), then the current path of the input voltage may include the capacitive device 115 that may increase a total impedance. The leakage current may be reduced by designing the capacitive device (or Cz) such that leakage current may be controlled.

FIG. 7 shows a chassis according to an example embodiment. Other embodiments and configurations may also be provided.

In at least one embodiment, a capacitor 200 may be provided at the chassis 100 in order to couple to a ground area of the circuit board. The capacitor 200 may physically couple between a ground area 211 of the circuit board 110 and an inner surface of the chassis 100. The capacitor 200 may be considered a capacitive device.

Embodiments may include an electronic device having a metal-insulator-metal (MIM) chassis. The inner metal layer (or first metal layer 152) of the chassis 100 may be metallic. However, the inner metal layer is not connected to a ground area of the circuit board 100. The connecting metal layer (or the second metal layer 156) of the chassis 100 may be connected to the ground area of the circuit board 110 in order to provide EMI shielding and Electrostatic Discharge (ESD) buffer requirement.

When an electrostatic discharge occurs to the electronic device having the second metal layer 156, energy may divert to the capacitive device, and more specifically to the second metal layer 156. The accumulated charges on the second metal layer 156 may then be gradually discharged. The second metal layer 156 may be called an ESD reservoir to temporarily store ESD energy and improve system ESD robustness.

Embodiments may provide a method of reducing leakage current by not including motherboard ground connections from the chassis ground. A capacitive device may be provided between the chassis ground and motherboard ground.

The MIM chassis may be obtained by coating an insulation layer (i.e., the insulating layer 154) on a metal chassis (i.e., the first metal layer 152) and following with another metal layer coating (i.e., the second metal layer 156). The MIM chassis area may be optimized to meet both EMI/ESD and leakage current requirement. Multiple capacitive devices may be provided on multiple distributed areas of the chassis. On the other hand, one capacitive device may be provided on one large dedicated area of the chassis.

Embodiments may be used for future wireless charging technology that some portion of the chassis has to be an active electrode or a coil. Additional shields or power rails may be designed in the MIM chassis structure. Wireless antennas may also be developed on the MIM chassis. A value of the capacitive device (i.e., the capacitor Cz) may be fine tuned by a coating area, and a selected material of an insulation layer with required dielectric constant.

The following examples pertain to further embodiments.

Example 1 is a chassis of an electronic device comprising a first metal layer to form an inner surface of the chassis, an insulating layer on the first metal layer, and a second metal layer on the insulating layer, the insulating layer to be between the first metal layer and the second metal layer, and the second metal layer to be connected to a ground area of a circuit board.

In Example 2, the subject matter of Example 1 can optionally include the insulating layer to be provided at a plurality of areas on the first metal layer.

In Example 3, the subject matter of Example 1 can optically include the second metal layer to be provided on the insulating layer at the plurality of areas.

In Example 4, the subject matter of Example 1 can optionally include the second metal layer to be connected to the ground area of the circuit board by a wire.

In Example 5, the subject matter of Example 1 can optionally include the second metal layer to be connected to the ground area of the circuit board by an electric connecting device.

In Example 6, the subject matter of Example 1 can optionally include the circuit board to receive power from a power source.

In Example 7, the subject matter of Example 1 can optionally include the first metal layer, the insulating layer and the second metal layer to form a capacitive device.

Example 8 is an electronic device to receive power comprising a circuit board to receive power, and to have a ground area, and a chassis to provide a structural support of components, the chassis to have a first metal layer to form an inner structure of the chassis, an insulating layer on the first metal layer, and a second metal layer on the insulating layer, and an electric connecting device to connect the ground area of the circuit board to the second metal layer.

In Example 9, the subject matter of Example 8 can optionally include the chassis to include a plurality of insulating layers at a plurality of areas on the first metal layer.

In Example 10, the subject matter of Example 9 can optionally include the chassis to include a plurality of second metal layers on the plurality of insulating layers.

In Example 11, the subject matter of Example 9 can optionally include a plurality of wires to be connected between the ground area of the circuit board and the plurality of second metal layers.

In Example 12, the subject matter of Example 10 can optionally include a plurality of electric connecting devices to be connected between the ground area of the circuit board and the plurality of second metal layers.

In Example 13, the subject matter of Example 8 can optionally include the first metal layer, the insulating layer and the second metal layer to form a capacitive device.

Example 14 is an electronic device to receive power comprising: a circuit board to receive a plurality of electrical components, and the circuit board to have a ground area, an inner metal layer to form an inner structure of the electronic device, a first insulating layer on a first portion of the inner metal layer, and a first connecting metal layer on the first insulating layer, the first connecting metal layer to be connected to the ground area of the circuit board.

In Example 15, the subject matter of Example 14 can optionally include a second insulating layer on a second portion of the inner metal layer.

In Example 16, the subject matter of Example 15 can optionally include a second connecting metal layer on the second insulating layer, the second connecting metal layer to be connected to the ground area of the circuit board.

In Example 17, the subject matter of Example 16 can optionally include the first connecting metal layer to be connected to the ground area of the circuit board by a wire.

In Example 18, the subject matter of Example 15 can optionally include the first connecting metal layer to be connected to the ground area of the circuit board by an electric connecting device.

In Example 19, the subject matter of Example 14 can optionally include the first connecting metal layer to be connected to the ground area of the circuit board by a wire.

In Example 20, the subject matter of Example 14 can optionally include the first connecting metal layer to be connected to the ground area of the circuit board by an electric connecting device.

In Example 21, the subject matter of Example 14 can optionally include the circuit board to receive power from a power source.

In Example 22, the subject matter of Example 14 can optionally include the inner metal layer, the first insulating layer and the first connecting metal layer to form a capacitive device.

Any reference in this specification to "one embodiment," "an embodiment," "example embodiment," etc., means that a particular feature, structure, or characteristic described in connection with the embodiment is included in at least one embodiment. The appearances of such phrases in various places in the specification are not necessarily all referring to the same embodiment. Further, when a particular feature, structure, or characteristic is described in connection with any embodiments, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An electronic device to receive power, comprising:
 a circuit board to receive power, and to have at least one ground area; and
 a chassis to provide a structural support of components, the chassis to have a first metal layer to form an inner structure of the chassis, a plurality of insulating layers at a plurality of areas on the first metal layer, and a plurality of second metal layers on the plurality of insulating layers, wherein the first metal layer, a first one of the insulating layers and a first one of the second metal layers to form a first capacitive device, and
 a plurality of electric connecting devices to connect the at least one ground area of the circuit board to the plurality of second metal layers.

2. The electronic device of claim 1, wherein the plurality of electric connecting devices includes a plurality of wires to be connected between the ground area of the circuit board and the plurality of second metal layers.

3. An electronic device to receive power, comprising:
 a circuit board to receive a plurality of electrical components, and the circuit board to have a ground area; and
 a chassis to support components, the chassis to include:
  an inner metal layer to form an inner structure of the chassis;
  a first insulating layer on a first portion of the inner metal layer;
  a second insulating layer on a second portion of the inner metal layer;
  a first connecting metal layer on the first insulating layer, the first connecting metal layer to be connected to the ground area of the circuit board; and
  a second connecting metal layer on the second insulating layer, the second connecting metal layer to be connected to the ground area of the circuit board, wherein the inner metal layer, the first insulating layer and the first connecting metal layer to form a first capacitive device.

4. The electronic device of claim 3, wherein the first connecting metal layer to be connected to the ground area of the circuit board by a wire.

5. The electronic device of claim 3, wherein the first connecting metal layer to be connected to the ground area of the circuit board by an electric connecting device.

6. The electronic device of claim 3, wherein the second connecting metal layer to be connected to the ground area of the circuit board by a wire.

7. The electronic device of claim 3, wherein the second connecting metal layer to be connected to the ground area of the circuit board by an electric connecting device.

8. The electronic device of claim 3, wherein the circuit board to receive power from a power source.

9. The electronic device of claim 3, wherein the inner metal layer, the second insulating layer and the second connecting metal layer to form a second capacitive device.

10. The electronic device of claim 3, wherein the first insulating layer contacts the inner metal layer, and the first connecting metal layer contacts the first insulating layer.

11. The electronic device of claim 10, wherein the second insulating layer contacts the inner metal layer, and the second connecting metal layer contacts the second insulating layer.

12. The electronic device of claim 3, wherein the second insulating layer is physically separated from the first insulating layer, and the second connecting metal layer is physically separated from the first connecting metal layer.

13. The electronic device of claim 1, wherein the first metal layer, a second one of the insulating layers and a second one of the second metal layers to form a second capacitive device.

14. The electronic device of claim 1, wherein the first one of the insulating layers contacts the first metal layer, and the first one of the second metal layers contacts the first one of the insulating layers.

15. The electronic device of claim 14, wherein a second one of the insulating layers contacts the first metal layer, and a second one of the second metal layer contacts the second one of the insulating layers.

16. The electronic device of claim 15, wherein the second one of the insulating layers is physically separated from the first one of the insulating layers, and wherein the second one of the second metal layers is physically separated from the first one of the second metal layers.

* * * * *